Figure 1:
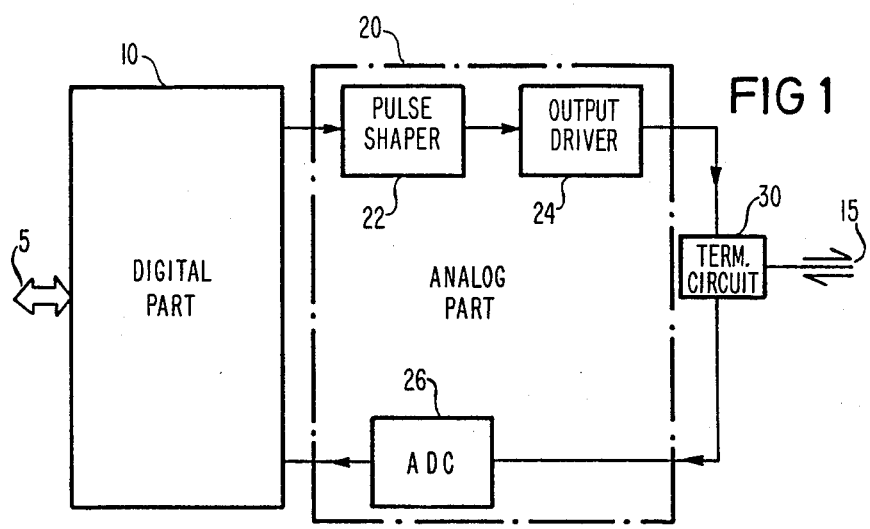

United States Patent [19]

Roessler et al.

[11] Patent Number: 4,814,637
[45] Date of Patent: Mar. 21, 1989

[54] PULSE SHAPER

[75] Inventors: Bernward Roessler; Eberhard Wolter, both of Munich, Fed. Rep. of Germany

[73] Assignee: Siemens Aktiengesellschaft, Berlin and Munich, Fed. Rep. of Germany

[21] Appl. No.: 100,804

[22] Filed: Sep. 24, 1987

[30] Foreign Application Priority Data

Sep. 26, 1986 [DE] Fed. Rep. of Germany ....... 3632798
Apr. 30, 1987 [DE] Fed. Rep. of Germany ....... 3714527

[51] Int. Cl.[4] .......................... H03K 4/2; H03K 5/1; H03K 5/156
[52] U.S. Cl. .................................. 307/268; 307/227; 307/246; 307/261; 328/14; 328/186
[58] Field of Search ............... 307/227, 261, 268, 246; 328/14, 186

[56] References Cited

U.S. PATENT DOCUMENTS 4,504,741  3/1985  Armitage ........................... 307/227
4,695,804  9/1987  Bardl et al. ........................ 328/14

OTHER PUBLICATIONS

Generation of Digital Signaling Waveforms by Herbert B. Voelcker, IEEE Transactions on Communication Technology, vol. Com 16, No. 1, Feb. 1986 pp. 81-93.
A Monolithic 1200 Baud FSK CMOS Modem by Carlos A. Lber, IEEE Journal of Solid-State Circuits, vol. Sc-19, No. 6, Dec. 1984, pp. 861-869.

Primary Examiner—John Zazworsky
Attorney, Agent, or Firm—David N. Caracappa

[57] ABSTRACT

A pulse shaper forms multi-level signals with staircase-shaped level transitions. The formation of these staircase-shaped level transitions takes place through charge exchange between a plurality of connected, component charge-forming charging capacitors and a summing capacitor adding the component charges.

10 Claims, 11 Drawing Sheets

PULSE SHAPER

The invention relates to a pulse shaper for converting multilevel input digital signals, associated with an input signal sequence with step-type level transitions, into individual output pulses having staircase-type level transitions, which, through linear superposition, form an output signal sequence corresponding to the input signal sequence.

Such pulse shapers are, for example, used in data transmission devices for duplex transmission of digital signals in adjoining frequency band systems over two-wire lines. For such duplex transmission, the digital signals, e.g. three- or four-level digital signals, are converted by a pulse shaper into analog signals, frequently into signals of $\sin^2$ shape. In addition to a pulse shaper, in such data transmission devices, an echo compensator is provided which compensates for the echo signals occurring due to interference between transmitter signals and receiver signals. If, for instance, in the transmission of three-level digital signals $(+1, 0, -1)$ or four-level digital signals $(+1, -1, +3, -3)$ with a particular echo compensator, the echo signals from the positive and negative digital signals are to be compensated with the same coefficient, apart from the sign, then the reshaped positive and negative digital signals corresponding to each other must be of congruent amplitude and shape.

A pulse shaper of the above mentioned kind is already known. (See, IEEE Transactions in Communication Technology, Feb. 1968, Vo. COM-16, Nr. 1, pages 81 to 93). In this known pulse shaper, a resistor arrangement is connected to a shift register, through which the digital signals to be shaped pass. A summing circuit receives component currents from this resistor arrangement responsive to the digital signals passing through the shift register. The output of the summing circuit produces a staircase-type output signal. The disadvantage of such pulse shapers is that staircase-type output signals of only one polarity can be generated, i.e. it is merely suitable for the formation of two level binary signals of staircase-type. That is, it is not suited for forming, for example, three-level or four-level digital signals (i.e. ternary or quaternary signals), which can have at least two values symmetrical to a reference value. The fixed connection of the resistors to the shift register does not permit use of the resistors in the formation of both the increasing and the decreasing staircase slopes of an output signal. Therefore, it becomes necessary to use, even with identical leading and trailing staircase slopes, a number of resistors equal to the sum of all steps.

Moreover, in connection with a frequency shift keyed FSK modem, it is already known to use a capacitor arrangement for generating sine-wave oscillations (See IEEE Journal of Solid-State Circuits, Vol. SC-19, Nr. 6, Dec. 1984, pp. 861–869). This capacitor arrangement consists of four capacitors, which are controlled by switches. The capacitor arrangement makes available, at given times, sequential component voltages. These component voltages are added by an additional summing capacitor.

It is desirable to obtain a pulse shaper of the above mentioned kind so that any multilevel output signals, including those having levels on both sides of a reference level, with staircase-type level transitions can be formed.

In accordance with principles of the present invention, such a pulse shaper includes a control signal generator having a plurality of outputs. Upon the occurrence of an input digital signal, the generator produces sequential control signals at its outputs at equidistant time intervals. The control signals in their totality, determine the duration of an output signal. The pulse shaper also includes a summing network, connected to at least some of the outputs of the control signal generator. At times determined by the occurrence of the control signals at the outputs of the control signal generator, the summing network first produces a component signal, in response to a particular control signal generator output, and corresponding to a given step of the output digital signal to be formed. The summing network then adds the time sequential component signals to the staircase-type output signals.

An advantage of the pulse shaper according to the present invention is that the charging capacitors, under control of the switch arrangement connected to them, can participate in the formation of the staircase-type output signals at any given time. Thus, a system arranged to form staircase-type output signals with identical leading and trailing slopes, requires only a number of charging capacitors equal in number to the number of steps in one of the slopes. By using charging capacitors, moreover, it is possible to form multilevel output signals, (for example, ternary signals or quarternary signals), having levels which are symmetrical to a given reference value. Because the same charging capacitors are always used to form corresponding portions of each slope, the magnitude of the levels of the output signal symmetrical to the reference value are the same, (apart from the sign;) thus, the shape and the amplitude of the output signals are identical.

One embodiment of a pulse shaper according to the present invention generates four-level output signals, which can assume two first values, symmetrical to a reference value and two second values also symmetrical to the reference value, but differing from the first values by a given integer factor. The advantage of this embodiment is that, with minimal additional circuitry, the requirement of identity of form and amplitude for values of the output signals corresponding to each other, and the requirement that the amplitude ratio of output signals of differing values be the given integer factor, are met by practical circuitry.

Figure 2:
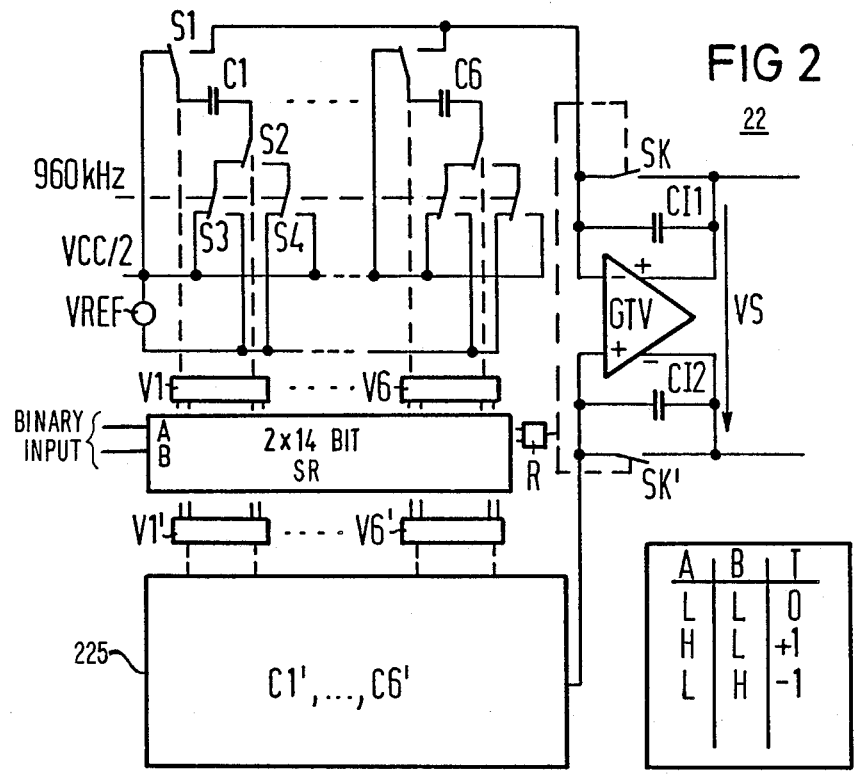
Figure 3A:
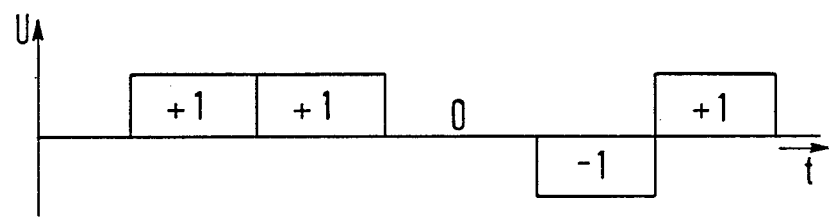
Figure 3B:
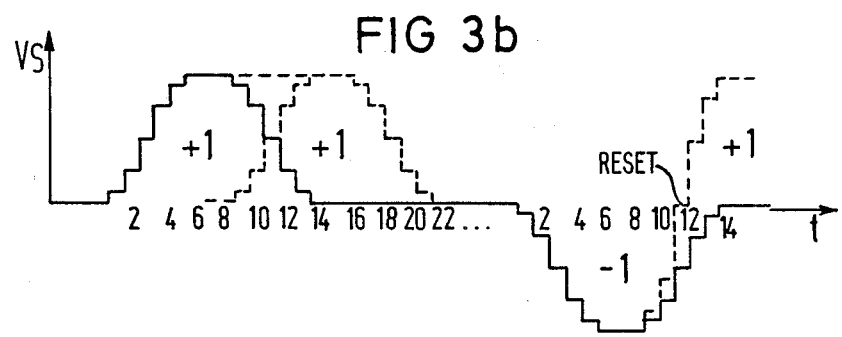
Figure 3C:
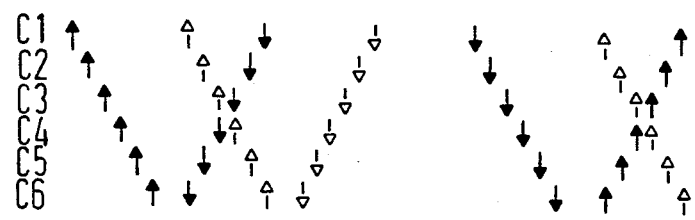
Figure 4:
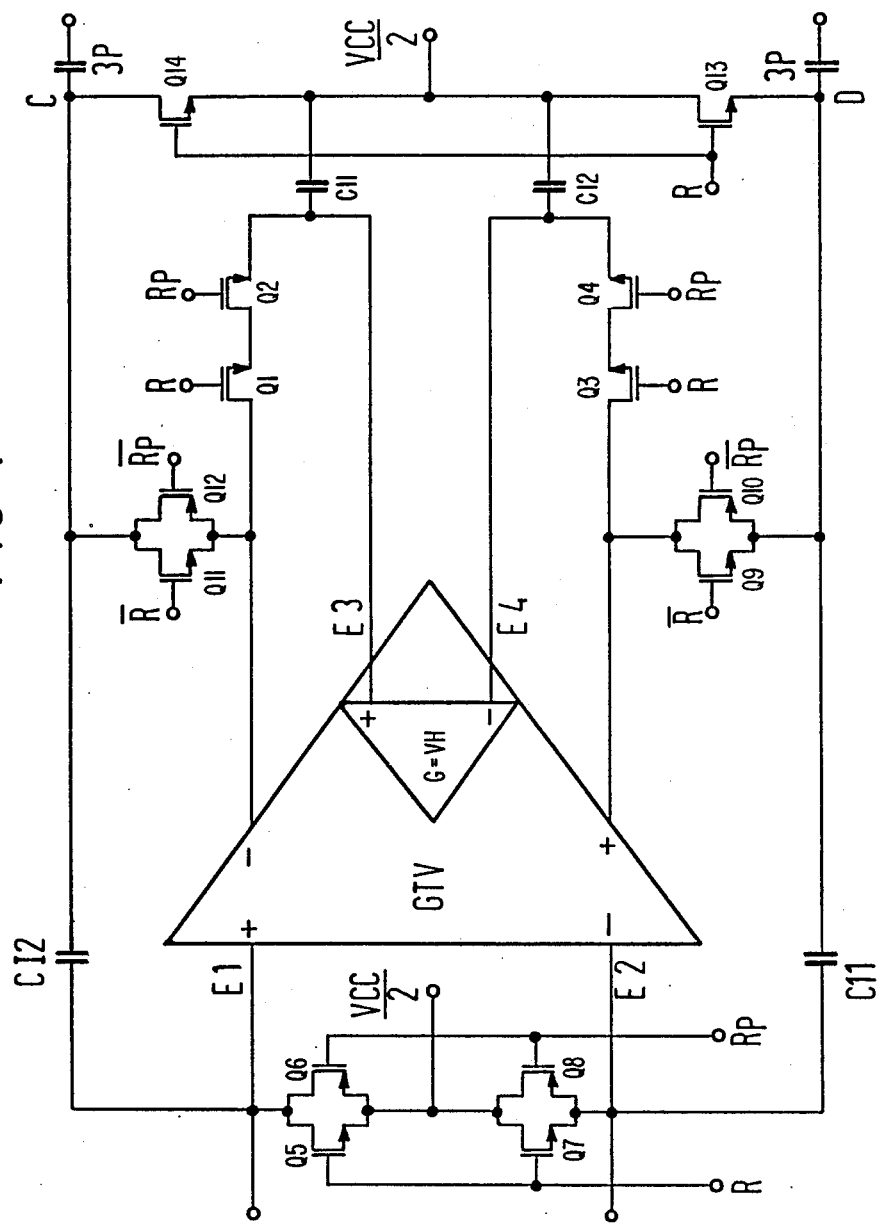
Figure 5:
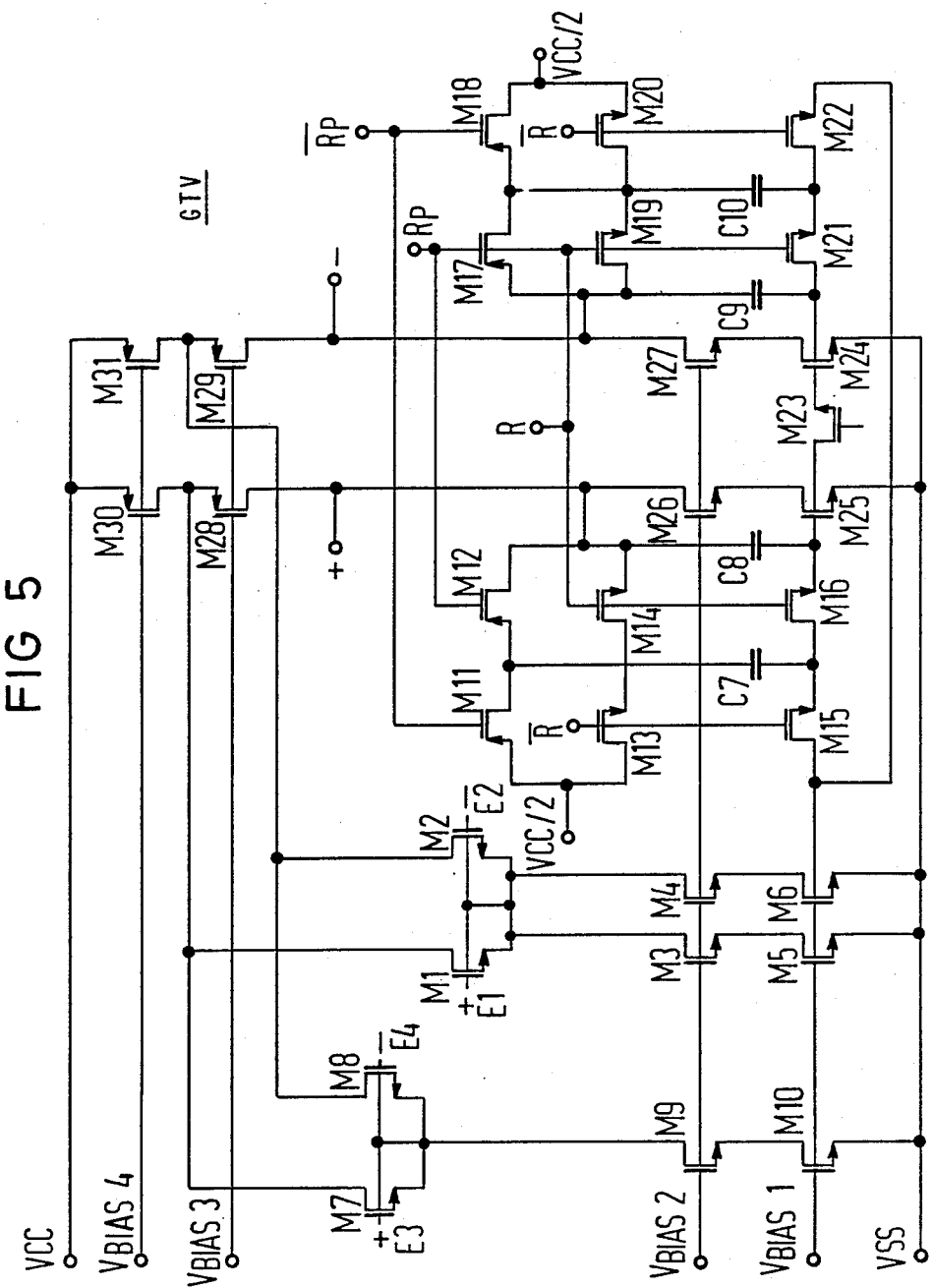
Figure 6:
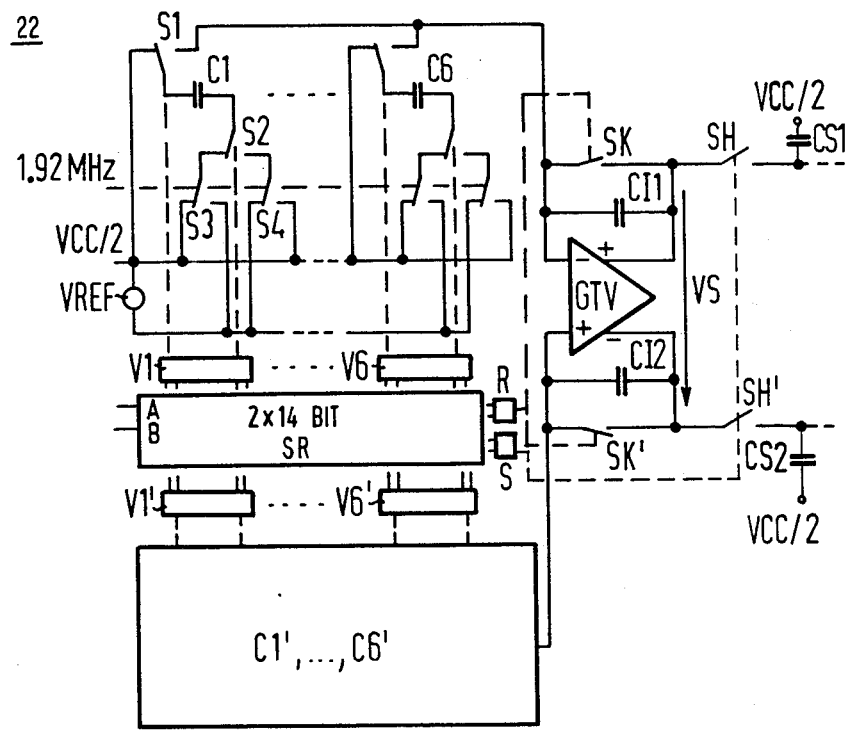
Figure 7:
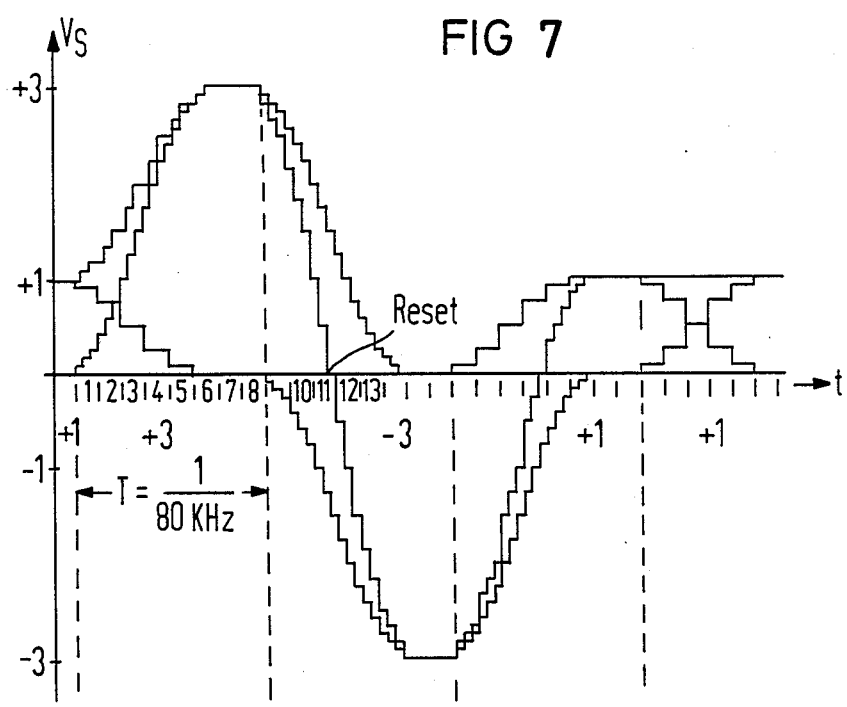
Figure 8:
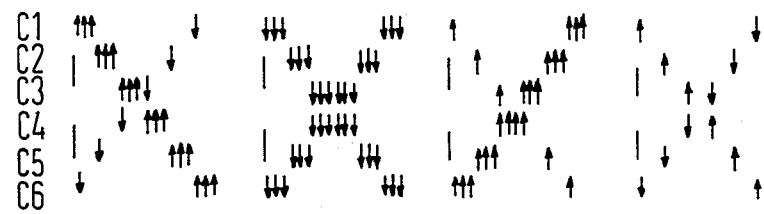
Figure 9:
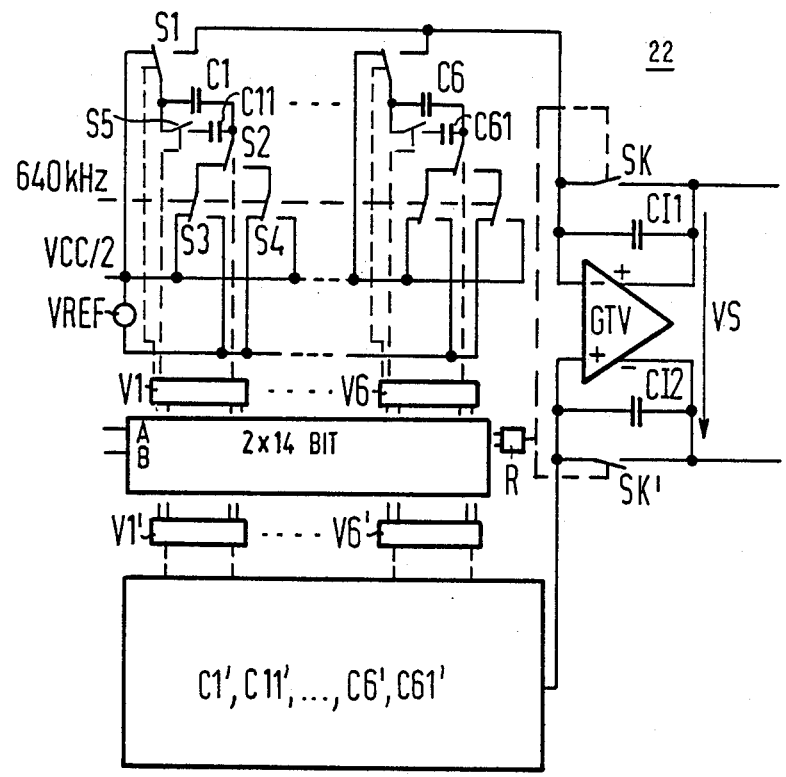
Figure 10:
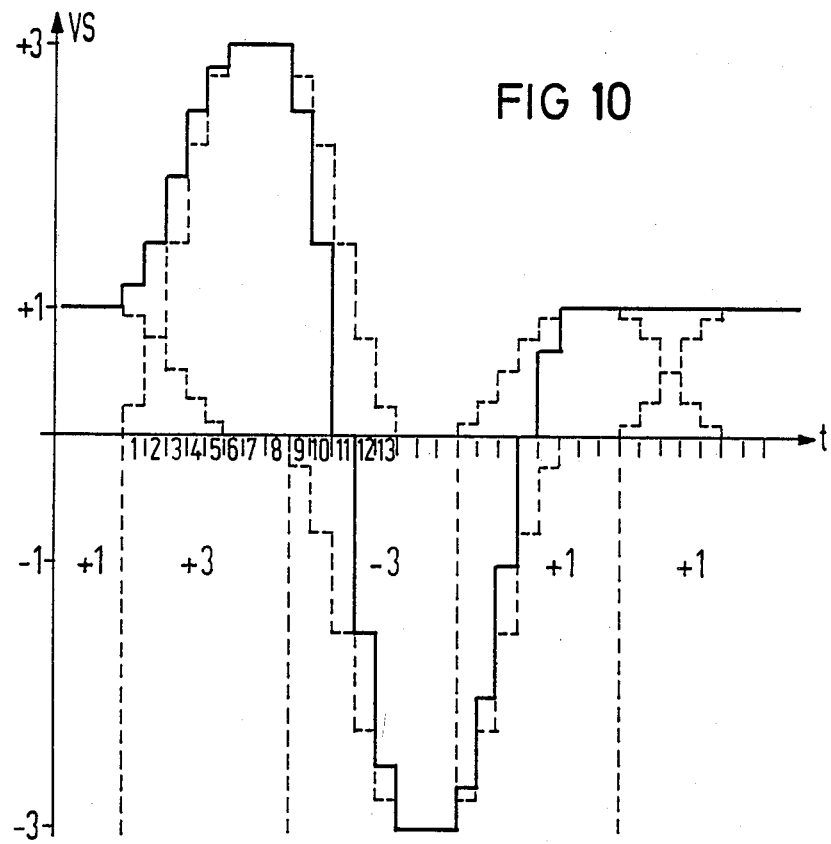
Figure 11:
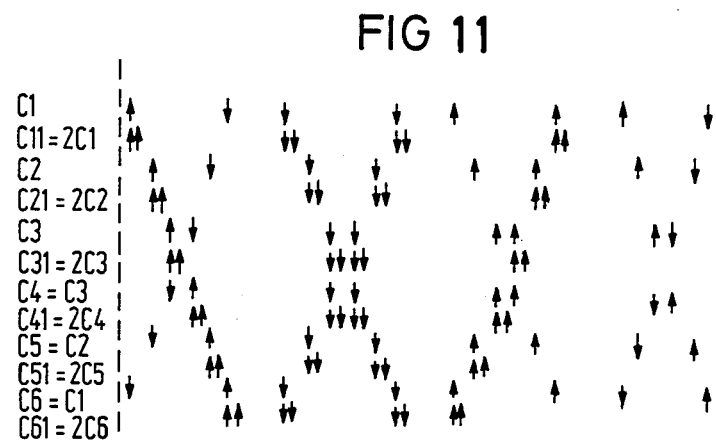
Figure 12:
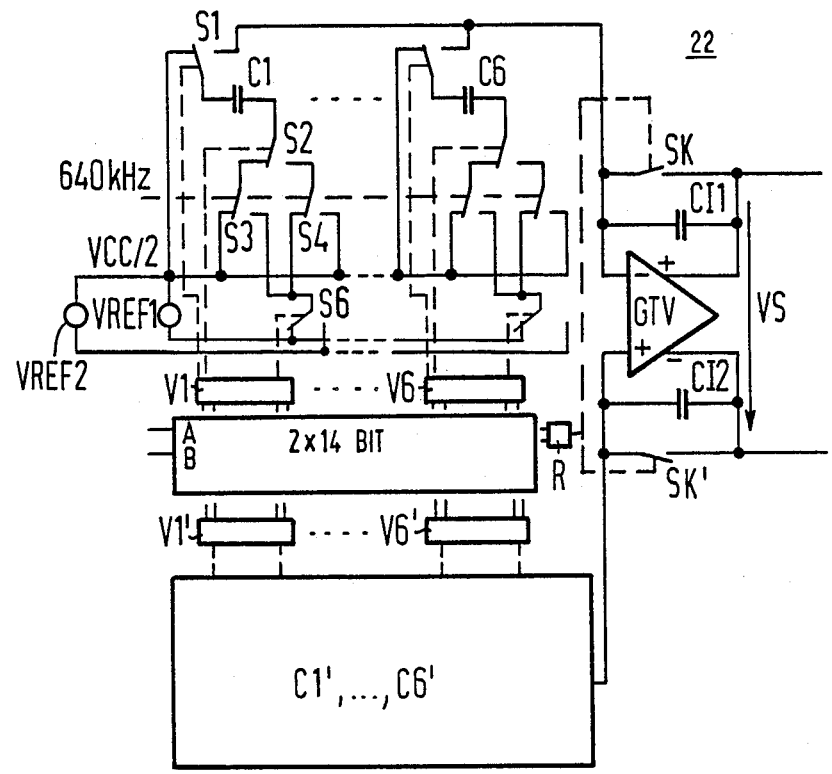
Figure 13:
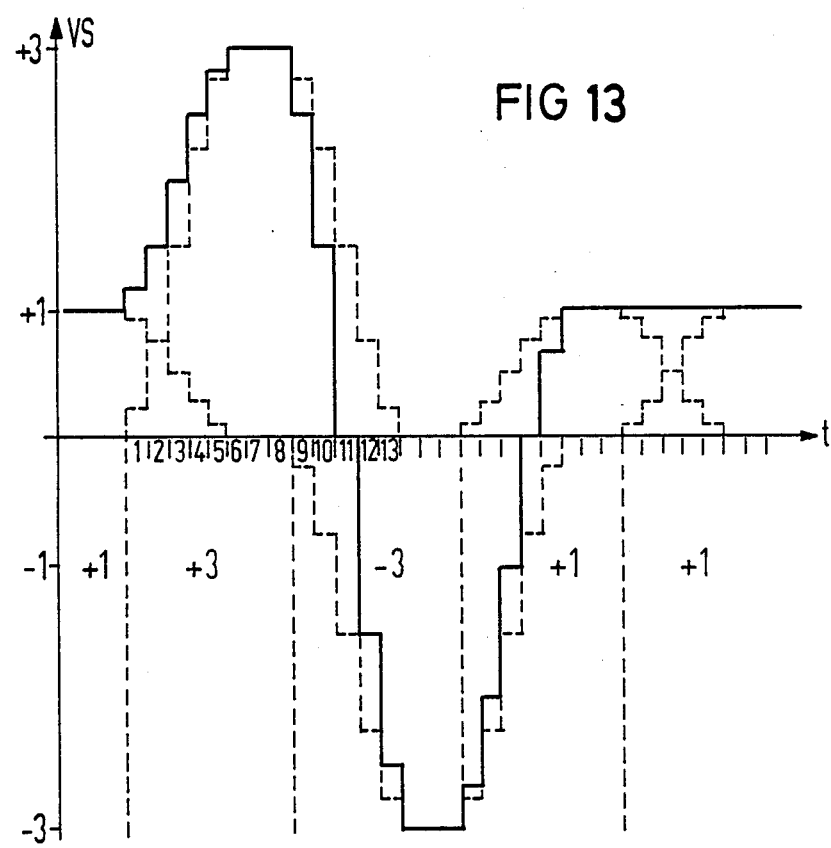
Figure 14:
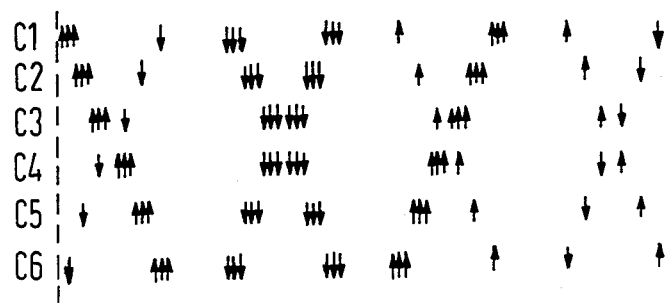
Figure 15B:
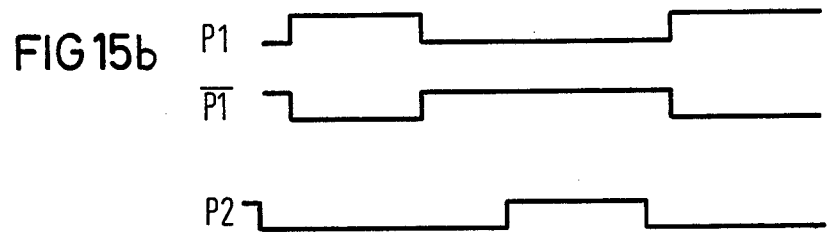
Figure 15A:
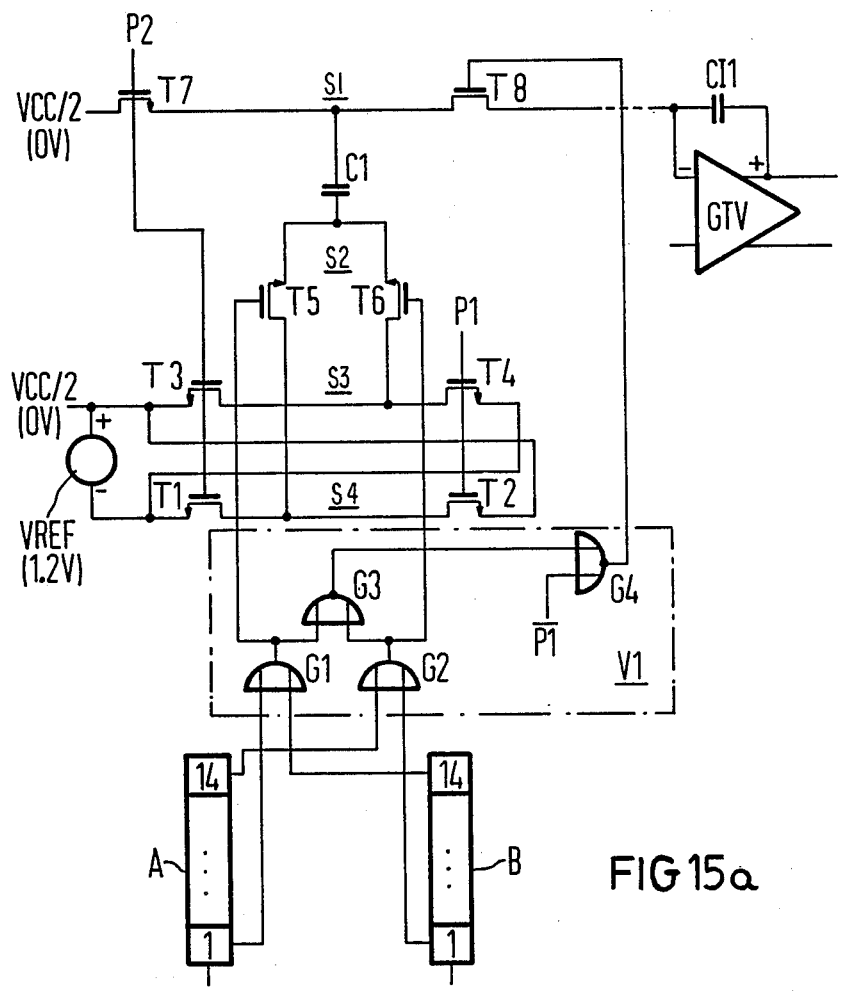

Below, the invention is explained in greater detail in conjunction with drawings serving as examples, which show in FIG. 1, a block diagram of a data transmission device including a pulse shaper according to the present invention;

FIG. 2, a block diagram of a first embodiment of a pulse shaper as illustrated in FIG. 1;

FIGS. 3a to 3c, waveform diagrams useful in understanding the operation of a pulse shaper as illustrated in FIG. 2;

FIG. 4, a schematic diagram of offset compensation circuitry for an operational amplifier illustrated in FIG. 2;

FIG. 5, a schematic diagram of an operational amplifier as shown in FIG. 2;

FIG. 6, a block diagram of a second embodiment of a pulse shaper as illustrated in FIG. 2;

FIGS. 7 and 8, waveform diagrams useful in understanding the operation of a pulse shaper as illustrated in FIG. 6;

FIG. 9, a block diagram of a third embodiment of a pulse shaper as illustrated in FIG. 2;

FIGS. 10 and 11, waveform diagrams useful in understanding the operation of a pulse shaper as illustrated in FIG. 9;

FIG. 12, a block diagram of a fourth embodiment of a pulse shaper as illustrated in FIG. 2;

FIGS. 13 and 14, waveform diagrams useful in understanding the operation of a pulse shaper as illustrated in FIG. 12;

FIG. 15a, a more detailed block diagram of a portion of a logic circuit and switch arrangement, as illustrated in FIG. 2; and FIG. 15b, waveform diagrams useful in understanding the operation of the logic circuit and switch arrangement as illustrated in FIG. 15a.

In FIG. 1, a data transmission device for duplex transmission of digital signals in an adjoining frequency band system over a duplex-channel system on a two-wire line is shown. The data transmission device may be assumed to be connected over the two-wire line 15 to, for example, transmission devices (not shown) in a central exchange. On the other hand, the data transmission device is connected over a four-wire line 5 with a data terminal (not shown). The data transmission device is formed by a digital part 10 and an analog part 20. The digital part 10 receives binary signals from the data terminal equipment over the four-wire line 5 and converts them into multilevel signals. The multilevel signals may be encoded, for example, in an AMI code, in a 4B-3T block code (ternary signals), or in a 2B1Q code (quarternary signals). After a code conversion of this nature the digital part 10 supplies the converted signal to a pulse shaper 22 associated with the analog part 20 of the data transmission device. Alternatively, the digital part 10 may supply information representing the multilevel digital signal in binary-coded form to the pulse shaper 22. This pulse shaper 22 converts the signals supplied to it into staircase-type analog multilevel signals (in a manner which will be explained more fully below), and passes these on to an output driver 24. The output driver 24 carries out a power amplification of the signals converted by the pulse shaper 22. The power-amplified signals from the output of this output driver 24 are coupled to the mentioned two-wire line 15 by a terminal circuit 30.

Input information signals, as received from the mentioned two-wire line 15, are picked p by the terminal circuit 30 and supplied to an analog-to-digital converter (ADC) 26. In addition to the input information signals, the terminal circuit 30 also receives interference signals, such as echo signals. These interference signals are produced during the transmission of the output signals, either directly in the terminal circuit 30 due to incomplete decoupling of the transmission paths, or due to reflection signals from reflection sites in the two-wire line. Consequently, the analog-digital converter 26 does not receive the actual input information signals alone, but instead receives a signal mixture consisting of the input information and the echo signals.

The signal mixture, in digital form, from the output of the analog-to-digital converter 26 is accepted by the digital part 10 of the data transmission device shown in FIG. 1. This digital part 10 includes an echo compensator, which separates the input information signals from the echo signals. The echo-signal-free signals, re-encoded into multilevel signals are subsequently encoded in the digital part into binary signals and transmitted over the four-wire line 5 to the mentioned data terminal equipment.

Following below, a more detailed description of the pulse shaper 22 of the data transmission device represented in FIG. 1 will be presented. First, an embodiment of the pulse shaper will be dealt with more fully, which, for example is suitable for forming three-level digital signals (ternary signals). The other elements illustrated in FIG. 1 are already sufficiently well known, that a description of their operating functions is superfluous.

Before discussing the layout of the pulse shaper 22 in more detail, some of the requirements, which must be fulfilled by the Pulse shaper will be initially presented. As already mentioned Previously, the output signals transmitted by the terminal circuit 30 over the two-wire line 15 must be appropriately shaped three-level signals. Such three-level signals have output pulses representing logic levels: +1, 0, and −1. In order to be able to use the same coefficients in the echo compensator, for +1 and −1 transmitter pulses, (aside from the sign) the amplitude and shape of the +1 and −1 transmitter pulses as generated by the pulse shaper, must conform as much as possible. In order to minimize the intensity of interference signals in the 2-wire line 15 a $\sin^2$ shape is generally prescribed for +1 and −1 output pulses. These $\sin^2$-shaped output pulses are wider by a factor of 13/8 than the width of the binary signals supplied by the data terminal set. Thus, for example, when transmitting a data sequence +1, +1; −1, −1, or +1, −1, portions of two output pulses are superimposed on each other. The superposition of these transmitter pulses must take place strictly linearly, so that the echo compensation for each separate output pulse of the superimposed three-level signal sequence can be carried out separately.

In FIG. 2, the structure of the previously mentioned pulse shaper 22 is shown in greater detail. This pulse shaper generates output pulses approximating the intended $\sin^2$ shape. The separate output pulses, which may have a transmission speed of 120 kHz (i.e. a repetition period of 8 960 kHz periods), each have a width 13 960 kHz periods. Pulse shaping is done through charge exchange between switched charging capacitors designated C1 and C6 in FIG. 2 and a summing capacitor CI1, which is coupled between a "−" input and a "+" output terminals of a push-pull operational amplifier GTV. In FIG. 2 the connection of the charging capacitor C1 with the associated switch arrangement is shown. A change-over switch S1 connects a first terminal of the charging capacitor C1 either to a terminal of the summing capacitor CI1 and the "−" input terminal of the operational amplifier GTV, or to a reference voltage source terminal VCC/2 (for example 0 V). A change-over switch S2 is connected to the other terminal of the charging capacitor C1 and is connected via the change-over switches S3 and S4 either to VCC/2 or to a reference voltage source terminal VREF. The change-over switches S3 and S4 are controlled by clock signals having a frequency of 960 kHz. The two change-over switches S1 and S2, however, are controlled by a logic circuit V1 coupled to predetermined register stages of a shift register arrangement SR. The other charging capacitors, C2 to C6, are each similarly connected by corresponding switch arrangements, as indicated for the charging capacitor C6. For example, the logic circuit corresponding to the charging capacitor C6 is designated V6 in FIG. 2.

The previously mentioned shift register arrangement SR is formed by two 14 bit shift registers A and B. The three-level digital signals, transmitted at a rate of 120 kHz to the pulse shaper 20 (of FIG. 1), are represented by binary coded signals. The binary coded signals are clocked into the two shift registers A and B. The truth table representing the binary coding is shown in FIG. 2. The ternary logic levels +1, 0, −1 for the three-level digital signals are listed in column T. In columns A and B, the two binary coded logic levels representing the ternary signals are listed. The binary coded signals A and B, coded according to the truth table, are clocked through the individual stages of shift registers A and B, respectively, at a rate of 960 kHz. For this the two shift registers receive a 960 kHz clock signal (not shown). Predetermined register stages of these two shift registers are connected to the above mentioned logic circuits V1 to V6 associated with charging capacitors C1 and C6.

A further logic circuit, designated R in FIG. 2, is connected with the shift registers A and B. An output from logic circuit R controls a switch SK, which, in response to the appropriate control signal, short-circuits and, thus, discharges, the already mentioned summing capacitor CI1.

The pulse shaper 22 shown in FIG. 2 has, in addition to the already mentioned charging capacitors C1 to C6, additional charging capacitors C1' to C6' (not shown), and associated switching arrangements (not shown) illustrated as a block 22S. Charging capacitors C1' to C6' are each connected to the associated switching arrangement (consisting of four change-over switches) in a manner similar to that of charging capacitors C1 to C6. These switch arrangements are connected to respective logic circuits V1' to V6'. Logic circuits V1' to V6' are coupled to predetermined register cells of the two shift register arrangements A and B. The charging capacitors C1' to C6' correspond in all other ways to the charging capacitors C1 to C6.

Further, another summing capacitor CI2 is provided, connected via the last mentioned switch arrangements to the charging capacitors C1' to C6', and corresponding to the summing capacitor CI1. This summing capacitor is coupled between a "+" input terminal and a "−" output terminal of the already mentioned push-pull operational amplifier GTV. A switch SK is coupled in parallel with this summing capacitor. This switch short-circuits and, thus, discharges the summing capacitor CI2 under the control of the already mentioned logic circuit R.

Below, the operating mechanism of the pulse shaper 22 shown in FIG. 2 is explained with reference to charging capacitors C1 to C6 and the summing capacitor CI1. As previously mentioned, the pulse shaper 22 receives three-level digital pulses at a rate of 120 kHz, which have been binary coded according to the truth table shown in FIG. 2. The individual binary coded samples are then clocked through the successive stages of the shift register SR at a rate of 960 kHz. Thus, at outputs of adjoining shift registers stages, successive signals corresponding to the binary coded samples occur. The presence of these signals for 13 960 kHz periods for each binary coded sample determines the width of each output pulse.

The output pulses are converted to staircase-type signals having 13 steps, each step corresponding to a predetermined one of the mentioned 13 periods. The staircase-type signal thus generated has roughly a sin$^2$ shape. Pulse shaping takes place through charge exchange between the charging capacitors C1 to C6 and the summing capacitor CI1. The direction of the current exchange determines whether the output voltage VS at the "+" output terminal of the push-pull operation amplifier GTV increases or decreases. For instance, the charging capacitor C1 may first be charged to the reference voltage VREF. The accumulated charge may then be conducted to the summing capacitor CI1. As a result, a voltage change of $VS = C1/CI1 \times VREF$ occurs at the output of the operational amplifier GTV. Conversely, the charging capacitor C1 may first be discharged. Then, charging capacitor C1 may be connected between the summing capacitor CI1 and the reference voltage source VREF. In this case, the charging capacitor C1 is charged by the summing capacitor (thus, discharging summing capacitor CI1). As a result, a voltage change of $VS = -C1/CI1 \times VREF$ occurs at the output of the operational amplifier GTV. Charge may be exchanged between the other remaining charging capacitors' (C2–C6) and the summing capacitor CI1 in a similar manner.

In FIG. 3a a three-level pulse sequence to be converted by the pulse shaper 22 is shown. A three-level pulse sequence +1, +1, 0, −1, +1 is given as an example. FIG. 3b, in contrast, shows the shaped output pulse sequence, corresponding to this input pulse sequence, as it appears at the output of the operational amplifier GTV. As already mentioned earlier, the individual output pulses making up this output pulse sequence are wider by a factor of 13/8 than the width of the three-level pulses supplied to the pulse shaper 22. On the x-axis of diagram 3b, the previously mentioned 960 kHz periods are shown, while on the y-axis the output voltage VS Present at the output of the operation amplifier GTV is indicated. In the arrow diagram in FIG. 3c the sequence, in which the charging capacitors C1 to C6 participate to form the output pulse sequence is shown. Positive voltage changes are indicated by arrows pointing up and negative voltage changes by arrows pointing down. The capacitance value of the charging capacitors C1 to C6 is calculated to be that required to generate the size voltage step required to generate an output pulse of the sin$^2$ shape.

Consider the generation of a +1 transmitter pulse. During the first 960 kHz period, the binary coded sample corresponding to a +1 transmitter pulse is in the first register stage of the shift register arrangement SR. In response to appropriate control signals from logic circuit V1 to the switch arrangement S1–S4, the charging capacitor C1 is first charged to VREF, then the accumulated charge is transferred to the summing capacitor CI1, and the charging capacitor C1 released. This causes a positive change to the output voltage VS at the output of the operation amplifier GTV. In the second to the sixth periods, the binary coded sample passes through shift register stages 2 to 6 of the shift register arrangement SR. During those periods, the same operation takes place with respect to charging capacitors C2 to C6, respectively. After the sixth period, the output voltage VS at the output of the operational amplifier GTV has reached its maximum value. During the 9th period the charging capacitor C1 is first discharged. It is then connected between the summing capacitor CI1 and the reference voltage source VREF. The charging capacitor C1 is thereby charged by the summing capacitor (thus discharging the summing capacitor CI1) and a negative change of the output voltage of operational amplifier GTV occurs. During periods 10 to 14 the same events take place with respect to the charging capacitors C2 to C6, respectively. Thus, each charging capacitor participates twice in succession during the generation of one +1 output pulse.

Consider now the generation of a −1 output pulse. During the first 960 kHz period, the charging capacitor C1 is first discharged and then charged by the summing capacitor CI1 (thus discharging summing capacitor CI1). During the next five periods the same operation is performed with respect to the charging capacitors C2 to C6, respectively. Compared to a +1 output pulse, charging and discharging of the summing capacitor CI1 by the respective charging capacitors are interchanged. Because the same reference voltage VREF, and charging capacitors are used during the generation of corresponding portions of both the +1 and −1 output pulses, the shape and amplitude of the +1 and −1 output pulses are identical independent of the capacitance value ratios, provided operational amplifier GTV is offset-free.

It is evident in FIG. 3b that, in a output pulse sequence +1, +1 or −1, +1, from the 9th to the 13th periods of the first pulse, a superposition takes place. Consider an output pulse sequence of +1, +1, for example. During the 9th period of the first +1 output Pulse, charging capacitor C6 is charged by summing capacitor CI1 (thereby discharging summing capacitor CI1). Simultaneously, however, the 1st period of the second +1 output pulse occurs. At that time, charge transfer occurs from the charging capacitor C1 to the summing capacitor CI1. These two charge transfers offset each other, and a linear superposition takes place. Because in the superposition of the two output pulses, the same charging capacitors take part as when generating individual output pulses, the superposition is linear and independent of capacitance value tolerance. In the above embodiment, summing capacitor CI1 is charged and discharged equally and no change in output voltage VS occurs.

If at some point in an output pulse sequence a 0 value output voltage should be generated, (e.g. at the 14th period for single transmitter pulse or at the 11th period for a change from +1 to −1 or from −1 to +1) then the summing capacitor is short-circuited, i.e. discharged, at that point in the output sequence. The switch SK (of FIG. 2) receives a control signal from the logic circuit R at the appropriate time. In FIG. 3b, during the transition from −1 to +1, such a discharge occurs, as illustrated, in the 11th period (reset). Through the discharge of the summing capacitor CI1, summing errors which have occured up to this point, due to a final amplification or an offset voltage of the operational amplifier GTV are eliminated.

The operating mechanism of pulse shaper 22 of FIG. 2, was explained above in conjunction with the waveform diagrams shown in FIG. 3, solely with reference to the charging capacitors C1 to C6 and the summing capacitor CI1. Charging capacitors C1' to C6' and the summing capacitor CI2 also participate in the generation of output pulse sequences. Pulses generated by exchanging charge between capacitors C1'–C6' and summing capacitor CI2 are summed at the "−" output terminal of the operational amplifier GTV. Compared to the output pulses summed the "+" output terminal, negative going output Pulses relative to a reference voltage (for example VCC/2) are summed at the "−" output terminal of operational amplifier GTV.

To minimize the non-linearities present in the output signals, which non-linearities affect the shape and amplitude of the +1 and −1 transmitter pulses, operational amplifier GTV is a push-pull amplifier. Push-pull operational amplifier GTV effects a reduction of the interference signal and an improvement in the signal-to-noise-ratio. In addition, the offset voltage of the operation amplifier GTV is reduced through a compensation circuit. This offset compensation, which is carried out during a reset phase of the pulse shaper 22, diminishes the 1/f transistor noise contribution in the operational amplifier GTV.

FIG. 4 shows offset compensation circuitry for operational amplifier GTV. The operational amplifier GTV has, in addition to the "+" and "−" input terminals shown in FIG. 2, (which are labeled E1 and E2 in FIG. 4), two auxiliary input terminals E3 and E4. In the reset phase, i.e. for a time interval following a reset signal from the logic circuit R (of FIG. 2), the auxiliary input terminal E3 is connected to the "−" output terminal of the operational amplifier GTV through the series connection of transistors Q1 and Q2. Similary, the auxiliary input terminal E4 is connected, in the reset phase, to the "+" output terminal of the operational amplifier GTV through the series connection of transistors Q3 and Q4. During the reset phase, transistors Q1, Q2, Q3 and Q4 are rendered conductive. In addition, a first pair of parallel-connected transistors Q5 and Q6, and a second pair of parallel-connected transistors Q7 and Q8 are coupled in series between the two input terminals E1 and E2 of the operational amplifier GTV. The junction Point between the two pairs of parallel-connected transistors is connected to VCC/2. Upon the occurrence of a reset signal, the transistors Q5–Q8, which are part of the series-connection, are all rendered conductive, so that during the reset phase and, thus, during the offset compensation phase, the same voltage is applied to the two input terminals E1 and E2.

The two already mentioned summing capacitors CI1 and CI2 are connected via respective pairs of parallel-connected transistors to a respective output terminals of the operational amplifier GTV. In Particular, the summing capacitor CI1 is connected to the "+" output terminal via transistors Q9 and Q10 and the summing capacitor CI2 is connected to the "−" output terminal via transistors Q11 and Q12. Both pairs of parallel-connected transistors are rendered nonconductive during the reset phase, so that the summing capacitors are isolated from the output terminals of the operational amplifier during the offset compensation. Simultaneously, the respective terminals of the summing capacitors CI1 and CI2 which are connected to the Parallel-connected transistors (Q9, Q10 and Q11, Q12) are connected via separate transistors Q13 and Q14, respectively, to VCC/2. Because during reset time, the other respective terminals of the summing capacitors CI1 and CI2 which are connected to the input terminals of the operation amplifier are also connected to VCC/2, a discharge of the summing capacitors takes place.

During the offset compensation phase, carried out during the reset phase, a state of equilibrium is reached which results in the offset voltage of the inputs E1 and E2 being reduced by the factor VH. The gain VH from the auxiliary input terminals E3 and E4 to the amplifier output terminals is approximately VH=100. The control voltages at the auxiliary input terminals are stored in two capacitors C11 and C12 and, therefore, is effective during the operational (non-reset) phase.

FIG. 5 shows the structure of the operational amplifier GTV. This operational amplifier has two parallel-connected current paths, each of which includes a series circuit of 4 current sources in form of transistors. The transistors forming the first series circuit are labeled M25, M26, M28, and M30. Those forming the second series path are labeled M24, M27, M29, and M31. The junction between the transistors M26 and M28 forms the "+" output terminal and the junction between the transistors M27 and M29 forms the "−" output terminal of the operational amplifier GTV.

The operational amplifier GTV, additionally, has two parallel-connected differential input transistor arrangements. The first arrangement consists of transistors M1 and M2, and the second consists of transistors M7 and M8. Each of the differential input pairs are series-connected with a respective current source arrangement. The current source arrangement series-connected with the differential transistor pair M1 and M2 is a parallel circuit of two pairs of series-connected transistors each. The first pair of series-connected transistors is labeled M3 and M5, and the second is labeled M4 and M6. The current source arrangement connected to the differential transistor stage M7 and M8, in contrast, is a single pair of series connected transistors M9 and M10.

The gate electrode of transistor M1 is coupled to input terminal E1, the gate electrode of transistor M2 is coupled to the input terminal E2, the gate electrode of transistor M7 is coupled to the input terminal E3 and the gate electrode of transistor M8 is coupled to the input E4.

The drain electrodes of transistors M1 and M7 are both connected to the junction point between the already mentioned transistors M28 and M30. In contrast, the drain electrodes of transistors M2 and M8 are both connected to the junction point between transistors M29 and M31.

The just mentioned transistors M1 to M10 and M24 to M31 form a "folded cascode" amplifier. The transistors M24 to M31 are load resistors for the earlier mentioned differential input transistor arrangements.

The operational amplifier shown in FIG. 5, moreover, has a common mode push-pull arrangement formed by transistors M11 to M23 the capacitors C7 to C10. The gate electrode of transistor M25 is connected to the "+" output terminal of the operational amplifier via transistors M11 to M16 and capacitors C7 and C8. In contrast, the gate electrode of transistor M24 is connected to the "−" output terminal of the operational amplifier via transistors M17 to M22 and capacitors C9 and C10. The current source transistors M24 and M25 of the cascade current sources are thus, on the one hand, component parts of the cascade current sources, which represent the load resistors of the differential input transistor arrangements, and, on the other hand, component parts of the mentioned common mode push-pull arrangement.

In each of FIGS. 6, 9, and 12, a further development of the pulse shaper 22 according to FIG. 2 is shown. With these further developments four-level output signals with staircase-shaped level transitions are formed. Such four-level digital signals may, for example, be encoded in a so-called "2B1Q" code (+3, +1, −1, −3). In order to simplify echo compensation as much as possible for this encoding process, it is preferable to use the same coefficient (aside from the sign), in the echo compensator for +1, −1 output pulses and to multiply this coefficient by the factor 3 for +3, −3 output pulses. Such approach is possible, if, aside from the sign, the shape and amplitude of the +1 and −1 output pulses are identical as are those of the +3, −3 output pulses. In addition, the amplitudes of the +3 and −3 transmitter pulses must differ by the factor 3 from that of the +1 and −1 transmitter pulses, respectively. These requirements are met by the mentioned further developments.

In the mentioned further developments, it is assumed, for example, that information regarding the four-level output signals to be formed is supplied to each of the particular pulse shapers 22 in binary coded form. For example, the possible four logic levels may be represented by a combination of 2 bits. One of these bits, for example, may represent the sign and remaining bit the logic level (1 or 3). From the successive input bit combinations (2 bits) supplied to the pulse shaper 22 according to FIGS. 6, 9 and 12, which may appear at a rate of 80 kHz, a binary coded sample is clocked through the register cells of the particular shift register SR at a rate of 640 kHz in the same way as in the already described pulse shaper 22 of FIG. 2.

The pulse shaper shown in FIG. 6 differs from the pulse shaper shown in FIG. 2 only in that the switches S3 and S4 assigned to the charging capacitors are controlled by clock signals at a frequency of 1.92 MHz and that a further logic circuit S is connected to the two shift registers A and B in shift register arrangement SR. The signal at the "+" output terminal of operational amplifier GTV is coupled to capacitor CS1 through switch SH, and the signal at the "−" output terminal of operational amplifier GTV is coupled to capacitor CS2 through switch SH'. Switches SH and SH' are controlled by signals from logic circuit S in a manner described below.

The formation of +1 and −1 output pulses takes place in the pulse shaper 22 shown in FIG. 6 in the same way as in the already described pulse shaper 22 of FIG. 2. That is, through appropriate control by the associated logic circuit of the switches S1 to S4 connected to the charging capacitors C1 through C6, a charge distribution takes place in those periods in which a voltage change is required in the output signal, as determined by the binary coded samples. This charge distribution effects, as already mentioned, a positive or negative voltage change at the operational amplifier GTV depending on the direction of the charge distribution. In forming +3 and −3 output pulses, however, three charge distributions in succession take place through the requisite control of switches S1 to S4 by the associated logic circuit during the selected periods. In those periods, thus, three voltage changes occur at the operational amplifier GTV. For +3 and −3 output pulses, output signals are generated, which, except for the number of steps, have the same shape as the output signals assigned to the +1 and −1 transmitter pulses and, compared to them, have an amplitude greater by a factor of 3. Thus echo compensation may be simplified, as described above.

In FIG. 7, for example, an output pulse sequence +1, +3, −3, +1, +1 is shown, as it occurs at the output of the operational amplifier TV. In this output pulse sequence, the individual output pulses are wider by a factor of 13/8 than the input signals supplied to the pulse shaper 22. On the x-axis the 640 kHz shift periods of the shift register arrangement A, B is shown, while on the y-axis the output voltage VS present at the output of the operational amplifier GTV is indicated. In the arrow diagram shown in FIG. 8, the charge transfer sequence is shown, illustrating which charging capacitors transfer charge during each shift period during output pulse shaping. Positive voltage changes are represented by the arrows pointing u and negative voltage changes are shown in arrows pointing down. Three arrows shown next to each other, indicate that, during the particular period considered, three voltage jumps take place in succession. The capacitance values of the charging capacitors is, as in the pulse shaper 22 according to FIG. 2, determined so that the individual voltage jumps at each of the shift periods results in an individual output pulse conforming as closely as is practical to the $\sin^2$ shape.

In FIGS. 7 and 8, in the assumed output pulse sequence +1, 30 3, −3, +1, +1, a superposition of the individual output pulses takes Place. An example of such superposition is in the output pulse sequence +3, −3 from the 9th to the 13th shift periods. In the 9th period, for example, a threefold charging of the charging capacitor C6 by the summing capacitor CI1 (i.e. discharging of summing capacitor CI1) occurs as in the individual +3 transmitter pulse. Simultaneously, as can be seem in the arrow diagram in FIG. 8, a threefold charging of the charging capacitor C1 by the summing capacitor CI1 also occurs (further discharging summing capacitor CI1). Corresponding superpositions also occur in the remaining transmitter pulse transitions. Because, in these superpositions, the same charging capacitors take part as in when shaping the individual pulses, the superposition shown in FIG. 7 is also linear and independent of the capacitance value tolerance.

If, in a transmitter pulse sequence, a change from: +1 to −1, −1 to +1, +3 to −3 or −3 to +3 occurs, the summing capacitor CI1 is short-circuited, that is discharged, at the earliest period in which the output voltage of the operational amplifier GTV is nominally 0. In FIG. 7 during the transition from +3 to −3, a discharge occurs, as illustrated, in the llth period. To cause this discharge the switch SK, shown in FIG. 6, is rendered conductive responsive to an appropriate reset signal from the logic circuit R. Through the discharge of the summing capacitors CI1 and CI2, both summing errors due to both final amplification and offset voltage of the operational amplifier GTV are eliminated as they are in the pulse shaper 22 according to FIG. 2. The offset compensation takes place in the manner already described above.

As explained earlier, the output signals occurring at the summing capacitors CI1 and CI2 for +3 and −3 output pulses have a threefold number of steps, compared to the number of steps for the output signals for +1 and −1 output pulses (due to a threefold charge distribution during the individual periods). The already mentioned switches SH and SH' are provided in order to reduce the number of these steps for +3 and −3 output pulses. These switches in combination with the capacitors CS1 and CS2 succeeding them, form respective sample and hold circuits. The switches SH and SH' here are driven by the logic circuit S in such a way, that they are closed only in the last third of each shift period shown in FIG. 7. Thus, they supply the output voltage present at the summing capacitors only at these given times, to capacitors CS1 and CS2. At the capacitors CS1 and CS2 thus, output signals, which are staircase-shaped with identical numbers of steps, always occur, i.e. the shape of the output signals is the same for all transmitter pulses. The amplitudes of the output signals for +3 and −3 transmitter pulses differ by a factor of 3 from +1 and −1 transmitter pulses, respectively. This allows for simplified echo compensation, as discussed above.

In FIG. 9, another embodiment of a pulse shaper 22 as shown in FIG. 2 is given. The pulse shaper 22 according to FIG. 9 differs from that shown in FIG. 2 only in that a series circuit consisting of an auxiliary capacitor and a switch S5 is parallel-connected to the charging capacitors C1 to C6 and C1' to C6.. The auxiliary capacitor connected in parallel with the charging capacitor C1 is designated C11. In corresponding manner, the remaining auxiliary capacitors are designated C21 to C61 and C11' to C61'. Each of these auxiliary capacitors has a capacitance value which is twice as large as that of the associated charging capacitors, for example C11=2C1.

The mentioned switches S5 are each controlled by the same logic circuit associated with the corresponding charging capacitor. Thus, the switch S5 associated with the charging capacitor C1 is controlled by the logic circuit V1.

Formation of +1 and −1 output pulses is carried out by the pulse shaper 22 according to FIG. 9 in the same way they are in the two previously mentioned pulse shapers. In forming +3 and −3 output pulses, however, through control of the switch S5 the auxiliary capacitor C11 is connected in parallel with charging capacitor C1, thus, both are included in the charge distribution. The remaining charging capacitors, C2 to C6 and C1' to C6', operate similarly. Through the so formed capacitor combinations, voltage changes are generated at the output of the operational amplifier GTV, which are 30 higher by a factor of 3 than those in the formation of +1 and −1 transmitter pulses. By including the charging capacitor C1 and the auxiliary capacitor C11 in the charge distribution, voltage changes become: $VS=(C1+C11)/CI1 \cdot VREF$ and $VS=-(C1+C11)/CI1 \cdot VREF$ (for negative changes). Thus, in the pulse shaper according to FIG. 9, the shape and the amplitude of +3 and −3 output pulses are also independent of the capacitance ratio. Here, the amplitudes are greater by the factor 3 than the amplitudes of +1 and −1 output pulses. In the amplitude ratios of output pulses of different levels, for example +1, +3, the capacitance value tolerances of the charging capacitors and the auxiliary capacitors are, indeed, included. These capacitance value tolerances, however, especially with pulse shapers built in integrated circuit technology, can be held within limits acceptable in practice.

In FIG. 10, again as example, an output pulse sequence +1, +3, −3, +1, +1 is shown, as it occurs at the output of the operational amplifier GTV. As mentioned in connection with FIG. 7, the individual output pulses associated with this output pulse sequence are wider by the factor 13/8 than the width of the signals supplied to the pulse shaper. On the x-axis, again, the 640 kHz shift periods implemented by the shift register arrangement A, B are shown, while on the y-axis the output voltage VS at the output of the operational amplifier GTV is listed. In the arrow diagram shown in FIG. 11, a sequence is indicated, as example, in which the charging capacitors C1 to C6 and the auxiliary capacitors C11 to C61 are effective in the output pulse shaping shown in FIG. 10. Positive voltage changes are again shown symbolically through arrows pointing up and negative voltage changes through arrows pointing down. Two arrows drawn next to each other indicate here, that the particular charging capacitor and the associated auxiliary capacitor, are switched in parallel and both exchange charge with the summing capacitor. The amount of combined charge is triple the amount of charge transferred by the charging capacitor alone. In the period labeled 1, the capacitor combination C1 and C11, for example, both discharge into summing capacitor CI1 which effects a positive voltage change of $VS=(C1+C11)/C11 \cdot VREF=3C1/C11 \cdot VREF$ at the output of the operational amplifier GTV.

From FIGS. 10 and 11 it is apparent that in the pulse shaper 22 according to FIG. 9 a superposition of the individual output pulses takes place. According to FIG. 10, such superposition occurs, for example, in the 9th through 13th period of the output pulse sequence +3, −3. In the 9th period of an individual +3 transmitter pulse, as is evident from FIG. 11, a recharging of both charging capacitors C1 and C6 and of auxiliary capacitors C11 and C61 by the summing capacitor C11 takes place (thus discharging summing capacitor C11). Correspondingly superpositions occur also in the remaining output pulse transitions shown in FIG. 10. Since in this superposition the same charging capacitors and auxiliary capacitors take part, here too the superposition, as in the case of single transmitter pulses, is linear and independent of the capacitance value tolerances.

In the pulse shaper 22 according to FIG. 9, too, at the occurrence of a change +1 to −1, −1 to +1, +3 to −3 or −3 to +3 the summing capacitors C11 and CI2 are short-circuited during the earliest possible period, in which the output voltage at the operational amplifier GTV is nominally zero. For this, the switch SK receives an appropriate reset signal from the logic circuit R as in the pulse shaper 22 according to FIG. 6. Also during the occurrence of this reset signal, simultaneously an offset compensation for the operational amplifier GTV is carried out in the above described manner.

In FIG. 12 yet another embodiment of the pulse shaper 22 illustrated in FIG. 2 is shown. The pulse shaper 22 according to FIG. 12 differs from that shown in FIG. 2 only in that the switches S3 and S4 associated with the charging capacitors are optionally connectable to two different reference voltage sources VREF1 and VREF2. The reference voltage source VREF2 here supplies a reference voltage higher by the factor 3, than that of the reference voltage source VREF1. Switch S6 selects the particular reference voltage sources to be applied to each of the charging capacitors. Switch S6 is controlled by the logic circuit associated with the associated charging capacitor, and connects one of the two reference voltage sources to the mentioned switches S3 and S4 in response to its control signal.

The formation of +1 and −1 output pulses takes place through the control of switches S1 to S4 and S6 associated with the charging capacitors C1 to C6 and C1' to C6' in the manner already discussed for the pulse shaper according to FIG. 2. The sole difference is that, in the formation of +1 and −1 output pulses, the reference voltage source VREF1 is selected by switch S6. In the formation of +3 and −3 output pulses the reference voltage source VREF2, is selected by switch S6. As already mentioned earlier, this reference voltage source supplies, compared to the reference voltage source VREF1, a reference voltage higher by the factor 3.

In FIG. 13, again as example, an output pulse sequence is shown, which corresponds to an input sequence +1, +3, −3, +1, +1 at the output of the operational amplifier GTV. FIG. 13 here is identical with FIG. 10. In the arrow diagram shown in FIG. 14, the same sequence is indicated illustrating the actions of the charging capacitors C1 to C6 in the output pulse shaping shown in FIG. 13. In this figure too, positive voltage jumps are represented symbolically through arrows pointing up and negative voltage jumps through arrows pointing down. The number of arrows shown in the individual periods for the charging capacitor indicate the magnitude of the voltage jumps caused by the charging capacitors as driven by one of the two reference voltage sources, VREF1 and VREF2.

Since in the pulse shaper 22 according to FIG. 12 the same charging capacitors take part for the formation of both the +1, −1 output pulses and +3, −3 output pulses, the shape of the mentioned output pulses is identical independent of the capacitance ratios. In the amplitude ratios of the output pulses for different input levels, for example, +1 vs. +3, the tolerances of the reference voltage sources affect performance, but in practice, these tolerances can be kept within limits acceptable for practical purposes.

The explanations in connection with the pulse shapers according to FIGS. 6 and 9 with respect to the superposition of the individual output pulses and with respect to setting the times for short-circuiting (thus, discharging) the summing capacitors C11 and C12 are also valid for the pulse shaper according to FIG. 12.

Below, using the pulse shaper 22 shown in FIG. 2 as an example, will be shown, how the switches S1 to S4 assigned to the charging capacitor (indicated only schematically) can be put into practice, for example, through MOS-FET transistor arrangements and how these can be driven by the logic circuits assigned to them. FIG. 15a shows the switch arrangement S1 to S4 assigned to the charging capacitor C1 (FIG. 2) and the logic circuit V1 associated with it.

The switch arrangement shown in FIG. 15a has two transistors T7 and T8, connected in series, which are connected to each other by their source electrodes. These two transistors form the change-over switch S1. The drain electrode of transistor T7 is connected to a source of reference voltage VCC/2 (which may be 0 V). The drain electrode of the transistor T8 is connected to a terminal of the summing capacitor CI1 and to the "−" input terminal of the operational amplifier GTV. One terminal of charging capacitor C1 is connected to the junction of the two transistors. The other terminal of this charging capacitor C1 is connected to respective source electrodes of two transistors T5 and T6. These transistors form the change-over switch S2. The drain electrode of transistor T5 is connected to the junction point formed by the drain electrodes of transistors T1 and T2. Transistors T1 and T2 form change-over switch S4. The source electrode of the transistor T1 is connected to the "−" terminal of a reference voltage source VREF, the other terminal of which is connected with VCC/2. The reference voltage supplied by reference voltage source VREF can be, for example, 1.2 V. The source electrode of transistor T2 is connected to VCC/2, for example, 0 V.

The mentioned transistor T6 is connected to a junction point formed by the drain electrodes of a series circuit of two transistors T3 and T4. These transistors represent the change-over switch S3. The source electrode of transistor T3 is connected to the VCC/2 terminal, and the source electrode of transistor T4 is connected to the already mentioned "−" connection of the reference voltage source VREF.

In FIG. 15a, furthermore, the two shift registers A and B are represented each with their register stages. Respective input terminals of an OR-gate G1 are connected to the first register stage of the shift register A and the 14th register stage of shift register B. The output terminal of OR gate G1 is connected, on the one hand, to the gate electrode of transistor T5 and, on the other hand, to a first input terminal of a NOR gate G3. The first register stage of the shift register B and the 14th register stage of the shift register A are connected to first and second terminals of an OR gate G2, respectively. The output terminal of OR gate G2 is connected, on the one hand, to the gate electrode of transistor T6 and, on the other, to the second input terminal of the already mentioned NOR gate G3. The output terminal of NOR gate G3 is connected to a first input terminal of a further NOR gate G4. The second input terminal of NOR gate G4 is responsive to the clock phase $\overline{P1}$ signal of the 960 kHz clock signals (as illustrated in the FIG. 15b). The output terminal of the NOR gate G4 is connected to the gate electrode of transistor T8.

The respective gate electrodes of transistors T1, T3 and T7 are each responsive to the clock signal P2. The gate electrodes of transistors T2 and T4 are each responsive to clock signal P1, which, as can be seen in FIG. 15b, does not overlap the clock signal P2.

Below, the operating mechanism of the just described circuit arrangement is explained. OR gate G1 controls the state of switch S2 so that the charging capacitor C1 causes a positive voltage jump at the output of the operational amplifier GTV. This, according to the table of values given in FIG. 2 and the output pulse sequence shown in FIG. 3b, must occur during the first period of a +1 transmitter pulse and in the 14th period of a −1 transmitter pulse. These periods are determined by the above stated connection of the input terminals of OR gate G1 with the appropriate stages of shift registers A and B.

OR gate G2 controls the state of switch S2 so that the charging capacitor C1 causes a negative voltage jump at the output of the operational amplifier GTV. This occurs, as, again, can be seen in FIG. 3b and the table of values in FIG. 2, in the first period of a −1 transmitter pulse and in the 14th period of a +1 transmitter pulse.

While generating a positive voltage jump at the output of the operational amplifier GTV (i.e. when a logic "1" signal is present at the first register cell of the shift register A or in the 14th register cell of shift register B) transistor T5 is driven conductive as controlled by the OR gate G1. During clock phase P2, the charging capacitor C1 is charged via transistors T1, T5 and T7 to the reference voltage VREF. During clock phase P1 the transistors T2 and T8 are driven conductive. The charging capacitor C1, now, has a first of its terminals coupled to the VCC/2 terminal via transistors T5 and T2, and has the second of its terminals coupled to summing capacitor CI1 through transistor T8. Thus, charge flows to the summing capacitor CI1. This causes a positive voltage jump at the output of the operational amplifier GTV.

While generating a negative voltage jump (i.e. when a logic "1" signal is present at the first register cell of the shift register B or at the 14th register cell of shift register A) the transistor T6 is driven conductive. During the next P2 clock phase, the charging capacitor C1 is discharge the transistor T3, T6, and T7. During the clock phase $\overline{P1}$, transistors T4, and T8 are driven conductive. The charging capacitor C1 now is coupled between the summing capacitor CI1 and the reference voltage VREF and accepts charge from the summing capacitor CI1. This causes a negative voltage jump at the output of the operational amplifier GTV.

With regard to the NOR gates G3 and G4 in FIG. 15, it may be Pointed out that these drive transistor T8 conductive only if the charging capacitor C1 actually takes part in a charge distribution. Above, the generation of positive and negative voltage jumps at the output of the operation amplifier GTV were explained in conjunction with FIG. 15 using the charging capacitor C1 as example. But corresponding processes take place for the remaining charging capacitors C2 to C6 and C1' to C6', if these are driven by logic circuits corresponding to the logic circuit V1. The time, at which the individual charging capacitors are to be activated, is set by connecting the input terminals of the corresponding OR gates to the appropriate register stages of the shift register A and B. The appropriate register stages are determined from FIG. 3b in connection with the table of values given in FIG. 2.

For the pulse shaper 22 shown in FIGS. 6, 9, and 12, logic circuits are provided corresponding to the logic circuit V1 shown in FIG. 15, and adapted to the formation of four-level output pulses. In these logic circuits too, selected register stages of the shift registers A and B are connected to the logic elements within the logic circuit. Under control of the appropriate logic circuit, the switches required at the times necessary for the formation of +3 and −3 transmitter pulses (described in conjunction with FIGS. 6, 9, and 12), are activated. These switches, in th pulse shaper 22 according to FIG. 9 and 12 are the switches S5 and S6, respectively. In the pulse shaper 22 according to FIG. 6, for example, for the formation of +3, −3 transmitter pulses each selected charging capacitor is to be included three times for succession in one charge distribution through an appropriate control of the particular associated switch S1 to S4.

The logic circuit R in FIGS. 2, 6, 9, and 12, and the logic circuit S in FIG. 6 each also contains logic decision elements, as would be known to one skilled in the art, in order to control times for short-circuiting the summing capacitors CI1 and CI2 closing of switches SH and SH' respectively in response binary-coded samples passing through the shift registers A and B.

Above, pulse shapers 22 for forming three-level and four-level transmitter pulses were explained for generating output pulse sequences having symmetrical staircase-shaped slopes. The described pulse shapers, however, may, through the appropriate choice of the number of the charging capacitors and the capacitance of the charging capacitors, generate output pulses having any staircase-shaped slopes. For example, output pulse sequences having unsymmetrical slopes can be formed. Moreover, the described pulse shapers can, through an appropriate adaptation and expansion, be constructed for the formation of any multi-level output pulse sequences.

In conclusion, it may be pointed out, that with the above-described pulse shapers a shift register arrangement A, B produces control signals for the associated logic circuits. Instead of this shift register arrangement, however, a more general device, called control signal generator, having a number of outputs corresponding to the number of register stages of the shift register arrangement A, B, may be use. The control signal generator produces sequential control signals at its output terminals at equidistant time distances in response to the binary-coded input signals. These control signals drive the logic circuits in the described pulse shapers in a similar manner as those driven by the register stages of the described shift register arrangement. As an example of such a control signal generator, a clock generator may, for example, be mentioned here, which is addressed by the input signals.

We claim:

1. Pulse shaper for reshaping multi-level input digital signals belonging to an input signal sequence having step-type level transitions into staircase-shaped output pulses with staircase-shaped level transitions, which by linear superposition form an output signal sequence corresponding to the input signal sequence, comprising:

a control signal generator, responsive to said input digital signals, and having multiple outputs, which upon the occurence of an input digital signal produces at its outputs sequential control signals at times being equidistant from each other, which in their totality determine the duration of an output digital signal;

a summing network, coupled to at least a portion of the outputs of the control signal generator, including a number of charging capacitors representing component charges, the number of which corresponds to the number of steps of one of the output pulses and a summing capacitor adding the component charges, said summing network making available at time intervals determined by the occurrence of control signals at the outputs of the control signal generator connected to the summing network at least one component signal assigned to the particular output any corresponding to a given step of the one of the output pulses to be formed and adding the time-sequential component signals to the staircase-shaped output pulses;

a plurality of controllable switch arrangements, for forming a component charge each of which having a first switch selectively coupling one of the terminals of an associated charging capacitor to either the summing capacitor or to a first terminal of a reference voltage source and a second switch selectively coupling the remaining one of the terminals of the associated charging capacitor to either the first or a second terminal of the reference voltage source, responsive to a switch control signal;

a plurality of logic circuits, coupled between the control signal generator and respective ones of the controllable switch arrangements, for generating said respective switch control signals; wherein:

each of the logic circuits, upon the occurrence of a control signal at the outputs of the control signal generator connected to the respective logic circuit, controls, by generating said switch control signals, the switch arrangement associated to the respective logic circuit in such a way, that the charging capacitor associated to the respective switch arrangement exchanges, independently of the other charging capacitors, a component charge with the summing capacitor, which charge corresponds to the step to be formed on the occurrence of the particular control signal.

2. The pulse shaper of claim 1 wherein:

the control signal generator consists of a shift register arrangement with multiple register stages, their number corresponding to the number of the control signals;

the shift register arrangement receives the information regarding the output signal as a sequence of samples in binary-coded form;

each binary-coded sample passes sequentially through the register stages at a rate corresponding to the equidistant times of the control signals, and each appearance of one of said binary-coded samples in the register stages represents a control signal.

3. The pulse shaper of claim 1, wherein:

four-level output signals are formed, which can assume two first vales symmetrical to a reference value and two second values likewise symmetrical to the reference value and differing from the first values by a given integer factor;

upon the occurrence of a binary coded signal corresponding to an output signal of one of said two first values, each of the charging capacitors exchanges charge with the summing capacitor at a time interval determined by the occurrence of a control signal only once, while upon the occurrence of a binary-coded signal corresponding to a output signal of one of said second values of each of the charging capacitors, in accordance with the given factor, exchanges charge with the summing capacitor at said time interval more than one time.

4. The pulse shaper of claim 3, wherein said summing network further comprises:

a switch coupled to the summing capacitor, and driven by a further logic circuit such that the summing capacitor can supply an output signal only at the end of each of the time intervals.

5. The pulse shaper of claim 1, wherein:

said summing network further comprises a plurality of auxiliary capacitors each corresponding to a respective charging capacitor;

said output signal sequence includes four-level output digital signals, which can assume two first values symmetrical to a reference value and two second values , likewise symmetrical to the reference value, and differing from the first values by a designated integer factor;

a charging capacitor and a corresponding auxiliary capacitor are selectively parallel-connected, upon the occurrence of a binary coded signal corresponding to an output digital signal of second value such that the capacitance of the particular capacitor combination consisting of charging capacitor and auxiliary capacitor exchanges a charge higher by said designated factor with the summing capacitor.

6. The pulse shaper of claim 5, wherein said summing network further comprises a plurality of seitches connected in series with respective auxiliary capacitors which switches can be driven by the logic circuit associated with respective charging capacitors such that an auxiliary capacitor is connected in parallel with an associated charging capacitor only upon the occurrence of output digital signals corresponding to binary-coded signals representing to said second value.

7. The pulse shaper of claim 1, wherein:

said reference voltage source further comprises a third terminal;

said output signal sequence includes four-level output digital signals, which can assume two first values, symmetrical to a reference value, and two second values, likewise symmetrical to the reference value and differing from the first values by a five integer factor;

each of the controllable switch arrangements selectively couples said second terminal of said corresponding charging capacitor to either said first and second terminals of said reference voltage source, respectively, in response to a binary-coded signal representing an output digital signal of said first value, or to said third and first terminals of said reference voltage source, respectively, in response to a binary coded signal representing an output signal of a second value, for forming said component charges;

the voltage at said third terminal of said reference voltage source is determined such that the particular charging capacitor exchanges a charge with the summing capacitor higher by said designated factor.

8. The pulse shaper of claim 1, wherein said summing network further comprises:
a further switch parallel to the summing capacitor which is controlled by an additional logic circuit connected with outputs of the control signal generator such that it short-circuits the summing capacitor at determined time intervals.

9. The pulse shaper of claim 8, wherein:
the summing network is present in duplicate;
the two summing capacitors are coupled to respective inputs and outputs of a push-pull operational amplifier.

10. The pulse shaper of claim 9, wherein:
during time intervals in which the summing capacitors are short-circuited, offset compensation is carried out for the push-pull operational amplifier.

* * * * *